United States Patent
You et al.

(10) Patent No.: US 11,862,530 B2
(45) Date of Patent: Jan. 2, 2024

(54) MULTI-LAYERED SPACER AND DOUBLE-SIDED COOLING POWER MODULE INCLUDING SAME

(71) Applicants: Hyundai Motor Company, Seoul (KR); Kia Motors Corporation, Seoul (KR)

(72) Inventors: Myung Ill You, Whasung-Si (KR); Jun Hee Park, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/030,672

(22) Filed: Sep. 24, 2020

(65) Prior Publication Data
US 2021/0358829 A1    Nov. 18, 2021

(30) Foreign Application Priority Data
May 12, 2020 (KR) .................. 10-2020-0056649

(51) Int. Cl.
*H01L 23/373* (2006.01)
*H01L 23/495* (2006.01)

(52) U.S. Cl.
CPC ...... *H01L 23/3735* (2013.01); *H01L 23/4952* (2013.01)

(58) Field of Classification Search
CPC ....... H01L 23/373–3738; H01L 23/488; H01L 23/4952; H01L 23/49811; H01L 23/5385; H01L 24/26–33; H01L 24/48; H01L 24/73; H01L 24/83
See application file for complete search history.

(56) References Cited

U.S. PATENT DOCUMENTS

| | | | | |
|---|---|---|---|---|
| 4,879,589 A | * | 11/1989 | Saint-Cyr | ............... H01L 21/50 257/703 |
| 5,463,251 A | * | 10/1995 | Fujita | ...................... H01L 23/13 257/706 |
| 2007/0210317 A1 | * | 9/2007 | Chou | .................... H01L 25/167 257/E33.076 |
| 2009/0194862 A1 | * | 8/2009 | Kitami | ............... H01L 23/4334 257/706 |
| 2011/0298121 A1 | * | 12/2011 | Nishibori | ............... H01L 23/24 257/784 |

(Continued)

FOREIGN PATENT DOCUMENTS

| | | | | |
|---|---|---|---|---|
| JP | 2007115731 A | * | 5/2007 | .......... B32B 15/018 |
| KR | 10-2018-0030298 A | | 3/2018 | |

(Continued)

*Primary Examiner* — Andres Munoz
(74) *Attorney, Agent, or Firm* — MORGAN, LEWIS & BOCKIUS LLP

(57) ABSTRACT

A multi-layered spacer of which a thermal expansion coefficient and a thermal conductivity are controllable and a double-sided cooling power module including the multi-layered spacer, is provided between a semiconductor chip and a substrate in a double-sided cooling power module. The multi-spacer includes first metal layers made of a first metal and provided as at least respective outermost layers, and a second metal layer made of a second metal having a thermal expansion coefficient lower than a thermal expansion coefficient of the first metal and disposed between the first metal layers provided as the outermost layers.

5 Claims, 4 Drawing Sheets

(56) References Cited

U.S. PATENT DOCUMENTS

| | | | | |
|---|---|---|---|---|
| 2012/0098090 A1* | 4/2012 | Hebert | ................... | H01L 24/37 |
| | | | | 257/532 |
| 2012/0306086 A1* | 12/2012 | Sugimura | ........... | H01L 23/3735 |
| | | | | 257/762 |
| 2013/0020694 A1* | 1/2013 | Liang | ................... | H01L 25/072 |
| | | | | 257/691 |

FOREIGN PATENT DOCUMENTS

| | | | |
|---|---|---|---|
| KR | 10-2018-0069231 A | 6/2018 | |
| KR | 10-2020-0129699 A | 11/2020 | |

\* cited by examiner

-PRIOR ART-

MULTI-LAYERED SPACER AND DOUBLE-SIDED COOLING POWER MODULE INCLUDING SAME

CROSS REFERENCE TO RELATED APPLICATION

The present application claims priority to Korean Patent Application No. 10-2020-0056649, filed May 12, 2020, the entire contents of which is incorporated herein for all purposes by this reference.

BACKGROUND OF THE INVENTION

Field of the Invention

The present invention relates to a multi-layered spacer and a double-sided cooling power module including the multi-layered spacer. More particularly, the present invention relates to a multi-layered spacer of which a thermal expansion coefficient and a thermal conductivity are controllable and a double-sided cooling power module including the multi-layered spacer.

Description of Related Art

A hybrid vehicle or an electric vehicle requires an electric motor for its propulsion. The electric motor is controlled by a power module. Thus, starting and output power of the electric motor can be adjusted.

Due to the continuous application of a high voltage to the power module, much heat is generated in the power module. Therefore, there have been many attempts to cool the power module. Among them, there is a double-sided cooling power module structured such that substrates each provided with a cooler are, respectively, provided over and under a semiconductor chip which is a key component of the power module. In this structure, the semiconductor chip is cooled from both sides.

To input an operation signal to the semiconductor chip, a signal lead is connected to the semiconductor chip via a wire through wire bonding.

The wire is inevitably curved because of the characteristics of wire bonding, coming into contact with the surface of a substrate when the semiconductor chip is disposed on the substrate. To prevent the contact between the substrate and the wire, a spacer is provided between the substrate and the semiconductor chip.

Heat occurring in the semiconductor chip and electric current flowing through the semiconductor chip are likely to be conducted to the spacer. Thus, the spacer has to be made of a material having a high electrical conductivity, a high thermal conductivity, and a least difference in coefficient of thermal expansion with the material of the substrate.

The spacers in the related art are typically made of Al—SiC, Al—C, or the like. In the instant case, since these materials are expensive, the spacers in the related art cannot be provided at a low price. On the other hand, in a case where the spacers are made of pure copper (Cu) which is relatively inexpensive, since copper has a high thermal expansion coefficient while a substrate has a low thermal expansion coefficient, a big difference occurs in the thermal expansion coefficient between the copper spacer and the substrate, resulting in strong stress in the spacer.

FIG. 1 is a cross-sectional view exemplarily illustrating a typical power module, and FIG. 2 is a cross-sectional view exemplarily illustrating a typical spacer.

As illustrated in FIG. 1, the typical power module includes an upper substrate 11 and a lower substrate 12. A semiconductor chip 40 is provided between the upper substrate 11 and the lower substrate 12. In addition, multilayer structures, each including metal plates 21 and 22 (or 23/24 and 25) and an insulating layer 81 (or 82) interposed between the metal plates 21 and 22 (or 23/24 and 25), are provided, respectively, between the upper substrate 11 and the upper surface of the semiconductor chip 40 and between the lower substrate 12 and the lower surface of the semiconductor chip 40. A thermal interface material TMI 71 is bounded between the metal plate 21 and the upper substrate 11 and a thermal interface material TMI 72 is bonded between the metal plate 23 and the lower substrate 12.

The semiconductor chip 40 is connected to a signal lead 41 through a wire 42. In addition, a power lead 50 is connected to the semiconductor chip 40 via the metal plates 22 and 25, and a middle spacer 60 is disposed to maintain a distance between the metal layer 22 and the metal 25.

A joint S between the metal plate 22 and the spacer 30 and a joint S between the spacer 30 and the semiconductor chip 40 are made through soldering.

In the instant case, as illustrated in FIG. 2, the spacer 30 is made of a composite material such as copper-molybdenum (Cu—Mo) and aluminum-silicon carbide (Al—SiC) rather than pure metal such as copper (Cu) to minimize a difference in thermal expansion coefficient between the spacer 30 and the solder joint S. FIG. 2 is a schematic view of a space made of a Cu—Mo composite material composed of copper (Cu) 31 and molybdenum (Mo) 32.

The surfaces of the spacer 30 are coated with a Cu layer 33 to prevent the semiconductor chip from being damaged due to inter-metal diffusion between the solder joint and the semiconductor chip during a high temperature process.

The material of the spacer 30 has to provide high heat dissipation. Thus, the content of the composite material in the entire material of the spacer is critical. However, the use of a composite material as the material of the spacer has many problems: preparation of the composite material is complicated; it is difficult to control conditions for obtaining a homogeneous composite material; and a composite material which is poorly homogeneous deteriorates the reliability of the power module.

The method of plating the Cu layer 33 on the surfaces of the spacer has a problem of increasing the cost associated with quality control and workability.

The information disclosed in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a multi-layered spacer of which a thermal expansion coefficient and a thermal conductivity are controllable and a double-sided cooling power module including the multi-layered spacer.

According to various aspects of the present invention, there is provided a multi-spacer provided between a semiconductor chip and a substrate in a double-sided cooling power module. The multi-spacer includes first metal layers made of a first metal and provided as at least respective outermost layers, and a second metal layer made of a second metal having a thermal expansion coefficient lower than a thermal expansion coefficient of the first metal and disposed between the first metal layers.

In the multi-layered spacer, the second metal layer is provided singular and is stacked between the first metal layers provided as the outermost layers.

In the multi-layered spacer, a plurality of first metal layers and a plurality of second metal layers may be alternately disposed between the first metal layers provided as the outermost layers.

In the multi-layered spacer, the second metal may exhibit lower solder wettability than the first metal.

In the multi-layered spacer, the second metal layer may be formed to 33% to 50% of a thickness of the entire spacer.

In the multi-layered spacer, the first metal may be Cu and the second metal may be Mo or CuMo.

According to various aspects of the present invention, there is provided a double-sided cooling power module including a semiconductor chip provided between an upper substrate and a lower substrate and a spacer disposed between the semiconductor chip and the upper substrate. The spacer includes: first metal layers made of a first metal and provided as outermost layers; and a second metal layer made of a second metal having a thermal expansion coefficient lower than a thermal expansion coefficient of the first metal and provided between the first metal layers.

The double-sided cooling power module may further include a signal lead through which a signal is transmitted and received to or from the semiconductor chip; a wire connecting the semiconductor chip and the signal lead; and metal plates made of a conductive material and are formed between the spacer and the upper substrate and between the semiconductor chip and the lower substrate, respectively, in which the metal plate and the spacer are connected to each other with a solder portion, and the spacer and the semiconductor chip are connected to each other with another solder portion.

In the double-sided cooling power module, the second metal may exhibit lower solder wettability than the first metal.

In the double-sided cooling power module, the spacer may have singular second metal layer that are stacked between the first metal layers provided as the outermost layers.

In the double-sided cooling power module, the spacer may include a plurality of first metal layers and a plurality of second metal layers alternately stacked between the first metal layers provided as the outermost layers.

In the double-sided cooling power module, the first metal may be Cu and the second metal may be Mo or CuMo.

In the double-sided cooling power module, the second metal layer that forms the spacer may be formed to 33% to 50% of a thickness of the entire spacer.

According to various exemplary embodiments of the present invention, the spacer is formed by stacking many layers of metal materials having different thermal expansion coefficients and thermal conductivities. Thus, the spacer of which a thickness is readily adjusted can be obtained.

In addition, a Cu plating layer does not need to be formed. This prevents an increase in thermal resistance between the semiconductor chip and the spacer, and thus the reliability of the power module can be improved.

Furthermore, the thermal expansion coefficient and the thermal conductivity of the spacer can be readily controlled by adjusting the number of different metal layers and the thickness of each of the different metal layers.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
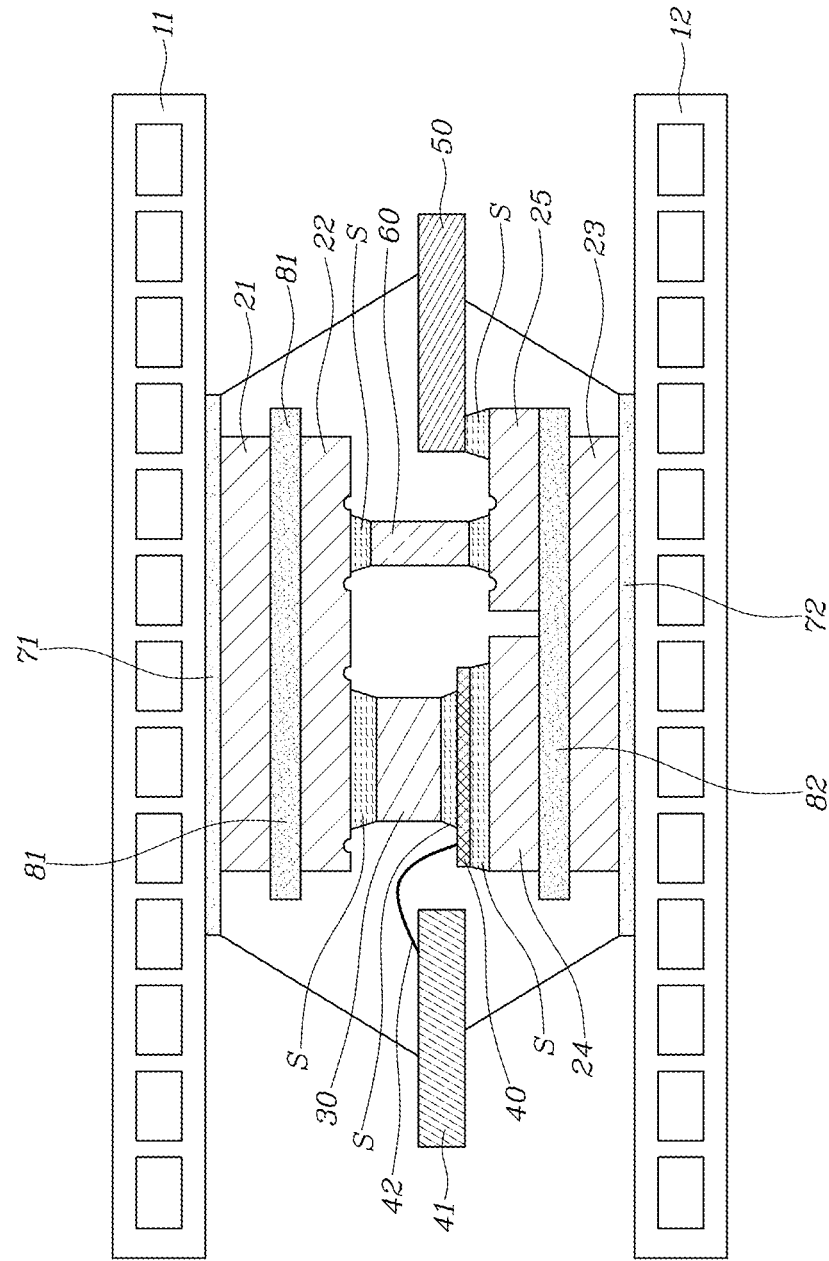
FIG. 1 is a cross-sectional view exemplarily illustrating a typical power module.
Figure 2:
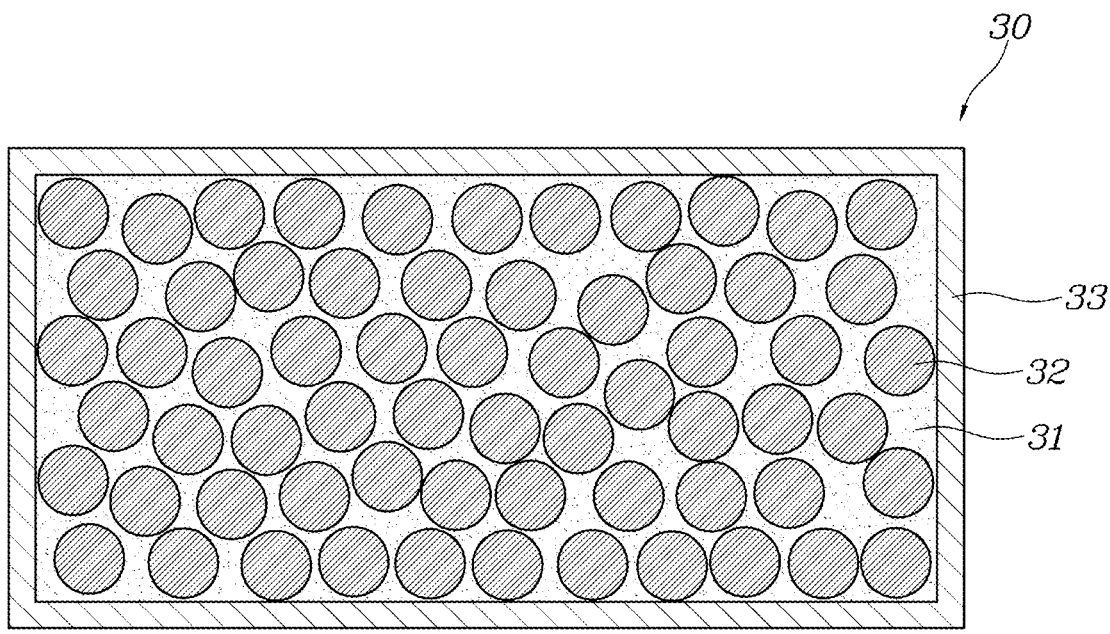
FIG. 2 is a cross-sectional view exemplarily illustrating a typical spacer.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the contrary, the present invention(s) is/are intended to cover not only the exemplary embodiments of the present invention, but also various alternatives, modifications, equivalents and other embodiments, which may be included within the spirit and scope of the present invention as defined by the appended claims.

Embodiments of the present invention will be described in more detail below with reference to the accompanying drawings. However, the present invention is not limited to the embodiments that will be included below, and various different embodiments thereof can be implemented. The embodiments are only provided to make a complete disclosure of the present invention and to provide full notice of the scope of the present invention to a person of ordinary skill in the art to which various exemplary embodiments of the present invention pertains. The scope of the present invention may be only defined by claims. Like constituent elements are provided like reference characters.

Figure 3:
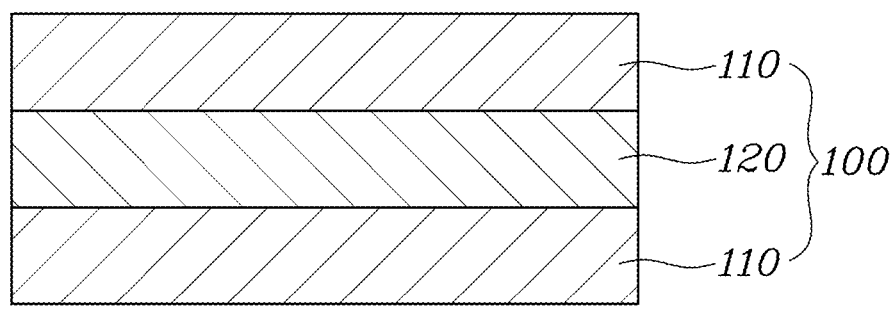
FIG. 3 is a cross-sectional view exemplarily illustrating a spacer according to various exemplary embodiments of the present invention.

FIG. 3 is a cross-sectional view exemplarily illustrating a spacer according to various exemplary embodiments of the present invention.

Like a spacer 30 that is illustrated in FIG. 1, the spacer according to various exemplary embodiments of the present invention is provided between an upper substrate 11 and a semiconductor chip 40.

In the instant case, a power module including the spacer 100 includes: a signal lead 41 through which a signal is transmitted to and received from the semiconductor chip 40, a wire 42 connecting the semiconductor chip 40 and the signal lead 41 to each other, and metal plates 21 to 25 made of a conductive material. The metal plates 21 and 22 are formed between the spacer 100 and the upper substrate 11, and the metal plates 23, 24, and 25 are formed between the semiconductor chip 40 and the lower substrate 12.

The typical power module illustrated in FIG. 1 and the power module 100 according to various exemplary embodiments of the present invention are the same in terms of constituent elements other than the spacer 100, the position of the spacer 100, and the bonding method. Therefore, a redundant description will not be given.

However, the spacer 100 according to the exemplary embodiment of the present invention is a multilayer structure in which layers of different metal materials are stacked.

To be more specific, the spacer 100 includes first metal layers 110 which are made of a first metal and serve as the outermost layers, and a second metal layer 120 made of a second metal having a lower thermal expansion coefficient than the first meta and disposed between the first metal layers 110. That is, the spacer 100 results from sequentially stacking the first metal layer 110, the second metal layer 120, and the first metal layer 110 in this order.

In the instant case, the first metal of which the first metal layer 110 is made of and the second metal of which the second metal layer 120 is made have different thermal expansion coefficients and thermal conductivities. Thus, a thermal expansion coefficient and a thermal conductivity of the entire spacer are adjusted by adjusting respective thicknesses of the first metal layer 110 and the second metal layer 120.

Specifically, the thermal expansion coefficient of the first metal is lower than that of the second metal.

Moreover, the second metal has lower solder wettability than the first metal.

For example, the first metal is made of Cu, and the second metal is made of Mo or CuMo.

Cu which is the material of the first metal layer 110 has a thermal expansion coefficient of $16.5 \times 10^{-6}$/K and a thermal conductivity of 386 W/mK. CuMo which is the material of the second metal layer 120 has a thermal expansion coefficient of $9 \times 10^{-6}$/K and a thermal conductivity of 200 W/mK. Thus, the thermal expansion coefficient and the thermal conductivity of the spacer 100 can be adjusted to $10 \times 10^{-6}$/K or below and 195 W/mK or above by adjusting the thicknesses of the first metal layer 110 and the second metal layer 120.

The outermost layers of the spacer 100 are implemented with the first metal layers 110 made of Cu. Soldering is performed on the first layers 110 made of Cu, thus it is not necessary to form Cu plating layers 33 on the surfaces of the spacer 30 unlike the spacer in the related art.

According to the exemplary embodiment of the present invention, since the surfaces of the spacer 100 are plated with a copper layer, the second metal layer 120 is exposed on lateral faces of the spacer 100. In the instant case, since Mo or CuMo of which the second metal layer 120 is made has a lower solder wettability than Cu of which the first metal layer 110 is made, when performing soldering to connect the spacer 100 with the metal plate 22 and the semiconductor chip 40, it is possible to prevent a solder portion S connecting the spacer 100 and the metal plate 22 from being connected to a solder portion S connecting the spacer 100 and the semiconductor chip 40 on a lateral surface of the spacer 100.

The second metal layer 120 has a sufficient thickness to prevent the solder portion S connected to the first metal layer 110 provided as the uppermost metal layer from being connected to the solder portion S connected to the first metal layer 110 provided as the lowermost metal layer, via the lateral surface of the second metal layer 120.

For example, the thickness of the second metal layer 120 accounts for about 33% to 50% of the total thickness of the spacer. In a case where the second metal layer 120 has a thickness smaller than a predetermined range suggested above, there is a risk that the solder portion S connected to the first metal layer 110 provided as the uppermost metal layer is electrically connected to the solder portion S connected to the first metal layer 110 provided as the lowermost metal layer, resulting in a short circuit. Conversely, in a case where the second metal layer 120 has a thickness greater than the predetermined range suggested above, the first metal layer 110 is formed to be excessively thin, which cannot secure a required thermal expansion coefficient and a required thermal conductivity of the spacer.

Figure 4:
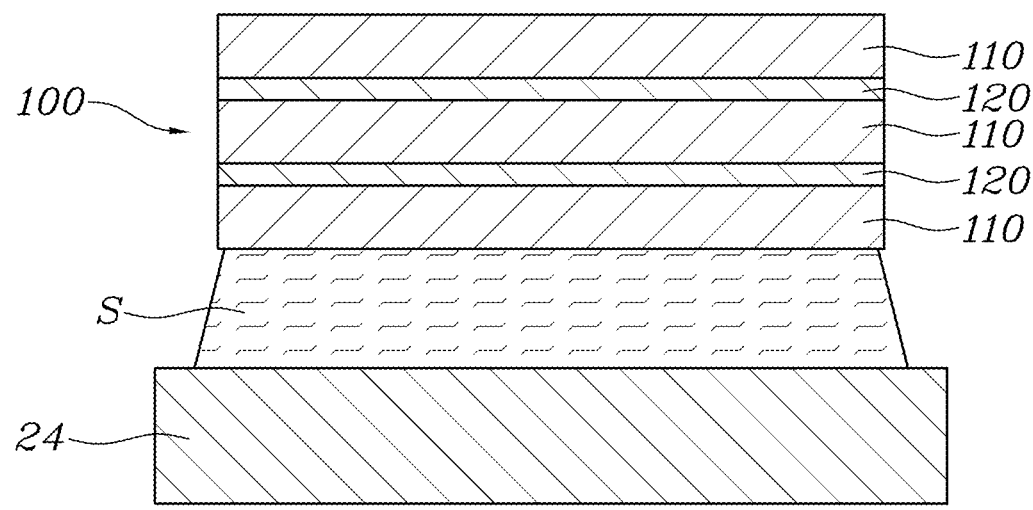
FIG. 4 is a cross-sectional view exemplarily illustrating a spacer according to various exemplary embodiments of the present invention.

The present invention is not limited to the spacer 100 structured such that the first metal layer 110, the second metal layer 120, and the first metal layer 110 are stacked in this order. As illustrated in FIG. 4, many first metal layers 110 and second metal layers 120 are alternately stacked between the two first metal layers 110 provided as the outermost layers.

For example, the metal layers are sequentially deposited on top of each other in this order: the first metal layer 110, the second metal layer 120, the first metal layer 110, the second metal layer 120, and the first metal layer 110. Even in the instant case, the outermost layers of the spacer 100 are implemented with the first metal layers 110.

Figure 5A:
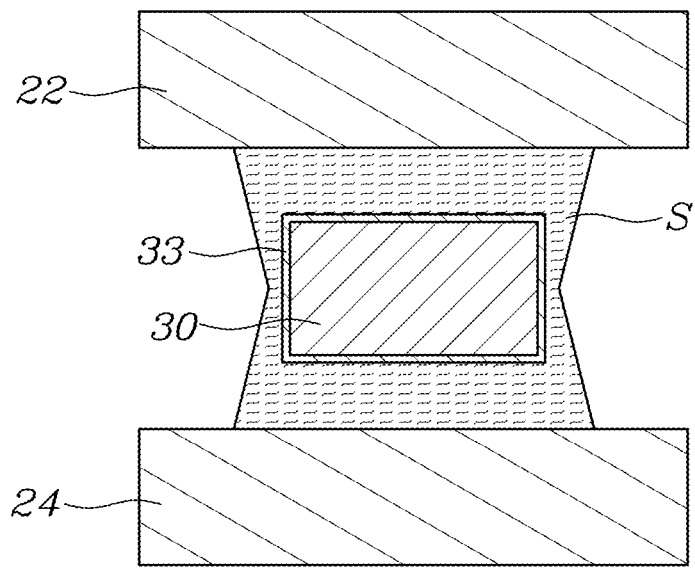
FIG. 5A and FIG. 5B are views illustrating a comparative example and an invention example in each of which a spacer and a solder joint are formed.
Figure 5B:
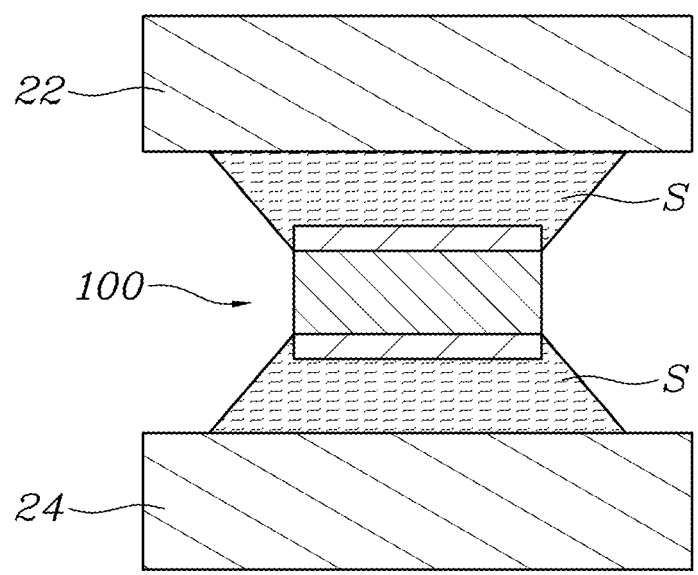

Next, with reference to a comparative example and an invention example, a solder joint on a spacer, according to the exemplary embodiment of the present invention, will be described, FIG. 5A and FIG. 5B are views illustrating a comparative example and an invention example in each of which a spacer and a solder joint are formed.

FIG. 5A is a view exemplarily illustrating a solder joint S on the spacer 30 in the related art in which the Cu plating layer 33 is provided, and FIG. 5B is a view exemplarily illustrating a solder joint S on the spacer 100 according to the exemplary embodiment of the present invention.

As illustrated in FIG. 5A, the Cu plating layer 33 covers the entire surface of the spacer 30 in the related art. Because of this, the solder joint S formed on the upper surface of the spacer 30 and the solder joint S formed on the lower surface of the spacer 30 undesirably extend up to a portion of the lateral surface of the spacer 30. Thus, a short circuit between an upper portion and a lower portion of the spacer 30 occurs.

In contrast, in the spacer 100 according to the exemplary embodiment of the present invention, since the metal material of which the second metal layer 120 is made has a poor solder wettability, as understood from FIG. 5B, the second metal layer 120 exposed on the lateral surface of the spacer 100 prevents the solder joint S formed on the first metal layer 110 provided as the uppermost metal layer from being connected to the solder joint S formed on the first metal 110 provided as the lowermost layer.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described in order to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A double-sided cooling power module comprising:
   a first insulating layer;
   a first upper metal plate disposed on an upper surface of the first insulating layer;
   a first lower metal plate disposed on a lower surface of the first insulating layer;
   a second insulating layer;
   a second upper metal plate disposed on an upper surface of the second insulating layer;
   a second lower metal plate disposed on a lower surface of the second insulating layer;
   a semiconductor chip provided between the first lower metal plate and the second upper metal plate;
   a signal lead through which a signal is transmitted to or received from the semiconductor chip;
   a wire connecting the semiconductor chip and the signal lead; and
   a spacer provided between the semiconductor chip and the first lower metal plate, to prevent a contact between the first lower metal plate and the wire,
   wherein the spacer includes a plurality of first metal layers made of a first metal and provided as outermost layers and a second metal layer made of a second metal having a thermal expansion coefficient lower than a thermal expansion coefficient of the first metal and disposed between the plurality of first metal layers,
   wherein a thermal expansion coefficient of the spacer is below a first threshold value and above the thermal expansion coefficient of the second metal,
   wherein the first threshold value is between the thermal expansion coefficient of the first metal and the thermal expansion coefficient of the second metal,
   wherein a thermal conductivity of the spacer is above a second threshold value and below a thermal conductivity of the first metal,
   wherein the second threshold value is below a thermal conductivity of the second metal,
   wherein one of the plurality of first metal layers that is forming an uppermost layer of the spacer is joined with the first lower metal plate through soldering,
   wherein another one of the plurality of first metal layers that is forming a lowermost layer of the spacer is joined with the semiconductor chip through soldering, and
   wherein the second metal has a solder wettability lower than a solder wettability of the first metal, and
   wherein a thickness of the second metal layer accounts for 33% to 50% of a total thickness of the spacer.

2. The double-sided cooling power module according to claim 1, wherein joining between the first lower metal plate and the spacer and joining between the spacer and the semiconductor chip are performed through the soldering.

3. The double-sided cooling power module according to claim 1, wherein the second metal layer is provided singular and is stacked between the plurality of first metal layers provided as the outermost layers.

4. The double-sided cooling power module according to claim 1,
   wherein the second metal layer is provided in plural to form a plurality of second metal layers, and
   wherein the plurality of second metal layers is alternately stacked between the plurality of first metal layers provided as the outermost layers.

5. The double-sided cooling power module according to claim 1, wherein the first metal is Cu and the second metal is Mo or CuMo.

* * * * *